United States Patent
Inoue et al.

(10) Patent No.: US 7,148,604 B2
(45) Date of Patent: Dec. 12, 2006

(54) PIEZOELECTRIC RESONATOR AND ELECTRONIC COMPONENT PROVIDED THEREWITH

(75) Inventors: Kenji Inoue, Tokyo (JP); Hisatoshi Saito, Tokyo (JP); Takao Noguchi, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 11/079,211

(22) Filed: Mar. 15, 2005

(65) Prior Publication Data

US 2005/0231072 A1    Oct. 20, 2005

(30) Foreign Application Priority Data

Mar. 22, 2004    (JP)    ............. P2004-083390

(51) Int. Cl.
H01L 41/04    (2006.01)
H01L 41/08    (2006.01)
H03H 9/205    (2006.01)

(52) U.S. Cl. ............... 310/322; 310/328; 333/187
(58) Field of Classification Search ........ 310/328, 310/322; 333/187
See application file for complete search history.

(56) References Cited

U.S. PATENT DOCUMENTS

| | | | |
|---|---|---|---|
| 6,841,922 B1 * | 1/2005 | Aigner et al. | 310/335 |
| 6,842,088 B1 * | 1/2005 | Yamada et al. | 333/187 |
| 6,933,807 B1 * | 8/2005 | Marksteiner et al. | 333/187 |
| 2001/0017504 A1 * | 8/2001 | Aigner et al. | 310/330 |
| 2002/0089393 A1 * | 7/2002 | Tikka et al. | 333/133 |
| 2002/0109564 A1 * | 8/2002 | Tsai et al. | 333/187 |
| 2004/0150293 A1 * | 8/2004 | Unterberger | 310/322 |
| 2004/0212458 A1 * | 10/2004 | Lee | 333/191 |
| 2004/0227591 A1 * | 11/2004 | Aigner et al. | 333/191 |
| 2005/0134406 A1 * | 6/2005 | Inoue | 333/187 |

FOREIGN PATENT DOCUMENTS

JP    A 05-167388    7/1993
JP    A 2003-022074    1/2003

* cited by examiner

Primary Examiner—Darren Schuberg
Assistant Examiner—J. Aguirrechea
(74) Attorney, Agent, or Firm—Oliff & Berridge, PLC

(57) ABSTRACT

A piezoelectric resonator according to an embodiment of the present invention has a first transducer connected to a first signal terminal, and a second transducer connected to a second signal terminal. The first transducer and the second transducer are stacked in a predetermined direction. At least one of the first transducer and the second transducer has a first piezoelectric film sandwiched between a pair of electrode films on both sides, and a second piezoelectric film comprised of a film type different from that of the first piezoelectric film and sandwiched between a pair of electrode films on both sides.

7 Claims, 5 Drawing Sheets

PIEZOELECTRIC RESONATOR AND ELECTRONIC COMPONENT PROVIDED THEREWITH

BACKGROUND OF THE INVENTION

1. Field of the Invention

The present invention relates to a piezoelectric resonator and an electronic component provided therewith and, more particularly, to a technology effective to achievement of a wider bandwidth of a passing property in a piezoelectric resonator having stacked transducers.

2. Related Background of the Invention

In recent years there are increasing demands for compact, low-loss, and wide pass bandwidth filters in order to keep up with fast large-volume communication. Filters meeting such demands and frequently used are Surface Acoustic Wave (SAW) filters with compact and low-loss characteristics, and antenna duplexers using the SAW filters. However, operating frequencies are becoming higher from demands for faster larger-volume communication.

A SAW filter is a filter for exciting and receiving a surface acoustic wave with use of interdigital electrodes in which electrode fingers in the width of about a quarter of the wavelength $\lambda$ of the propagating surface acoustic wave are alternately placed on a piezoelectric substrate. The line width of the electrode fingers of the SAW filter used in 2-GHz band systems is approximately 0.4 μm. For supporting achievement of higher frequencies of this SAW filter, it is necessary to precisely process the electrode fingers of not more than 0.4 μm. Therefore, there is a high possibility of considerable degradation of productivity.

A SAW filter is disclosed, for example, in Japanese Patent Application Laid-Open No. 5-167388.

Under such circumstances, attention is drawn to transducers with a piezoelectric thin film being a kind of devices using the Bulk Acoustic Wave (BAW devices), for example, as described in Japanese Patent Application Laid-Open No. 2003-22074. The operating frequency of the BAW devices is determined by the thickness of the piezoelectric film interposed between input and output electrodes.

In passing, the conventional transducer filters using ceramics or quartz have not been used for high-frequency usage, because it is difficult to precisely process the thin piezoelectric film. On the other hand, in the case of thin-film transducer filters, the piezoelectric film can be formed by means of a film-forming system of sputtering or the like; therefore, it is easy to obtain the piezoelectric film in a desired thickness. The thin-film transducer filters thus have advantage in achievement of higher frequencies. The electrodes used in the thin-film transducer filters are flat-plate electrodes. Since the thin-film transducer filters do not have to use the thin electrodes as used in the SAW filters, high-power signals can be handled therein accordingly.

A piezoelectric resonator comprised of a conventional stack type transducer is shown in FIG. 4.

The conventional piezoelectric resonator 40 shown in FIG. 4 is composed of a substrate 11, for example, of silicon, an acoustic multilayer reflecting film 12 disposed on the substrate 11, and a transducer 29 disposed on the acoustic multilayer reflecting film 12. The acoustic multilayer reflecting film 12 has first reflecting films 12a and second reflecting films 12b alternately stacked. The first reflecting films 12a and the second reflecting films 12b have their respective acoustic impedances different from each other. The transducer 29 has a first electrode film 28a, a piezoelectric film 28b, and a second electrode film 28c stacked in order. A plurality of such transducers 29 in the structure in which the piezoelectric film 28b is sandwiched between the upper and lower electrode films 28a, 28c, are two-dimensionally arranged and the transducers 29 are electrically connected in a ladder configuration, thereby constituting a filter or a duplexer.

SUMMARY OF THE INVENTION

Since the filters of this structure normally use about five to seven transducers, it was, however, impossible to realize the chip area of not more than (the number of transducers× the area of transducers).

There are also known filters such as a stacked transducer filter in which transducers are three-dimensionally arranged by stacling two or more piezoelectric films (SCF: Stacked Crystals Filter) or a multi-mode transducer filter in which a propagation layer is disposed between transducers (CRF: Coupled Resonator Filter). However, since SCF is a narrowband filter, it is unsuitable for broadband application. CRF uses multiple modes and is thus advantageous in achievement of wider bandwidths, but it could hardly be said that CRF is adequate to achievement of much wider bandwidths expected from future development toward faster larger-volume communication.

An object of the present invention is therefore to provide a technology capable of achieving a wider bandwidth of the passing property in a piezoelectric resonator in the structure in which a plurality of transducers are stacked.

A first piezoelectric resonator according to the present invention comprises a first transducer connected to a first signal terminal, and a second transducer connected to a second signal terminal. The first transducer and the second transducer are stacked in a predetermined direction. In the first piezoelectric resonator, the second transducer outputs a signal of a predetermined resonance frequency obtained from a bulk acoustic wave excited in the first transducer and propagating in the predetermined direction inside a piezoelectric film. At least one of the first transducer and the second transducer has a first piezoelectric film sandwiched between a pair of electrode films on both sides, and a second piezoelectric film comprised of a film type different from that of the first piezoelectric film and sandwiched between a pair of electrode films on both sides.

A second piezoelectric resonator according to the present invention is the first piezoelectric resonator wherein the electrode film more distant from the second piezoelectric film out of the pair of electrode films between which the first piezoelectric film is sandwiched, and the electrode film more distant from the first piezoelectric film out of the pair of electrode films between which the second piezoelectric film is sandwiched, are connected to the first signal terminal or to the second signal terminal.

A third piezoelectric resonator according to the present invention is the first or second piezoelectric resonator wherein one of the first piezoelectric film and the second piezoelectric film is comprised essentially of AlN and the other is comprised essentially of ZnO.

A fourth piezoelectric resonator according to the present invention is any one of the first to third piezoelectric resonators wherein, where $\lambda$ represents a wavelength of the bulk acoustic wave in the piezoelectric film determined by the film type of the piezoelectric film, a thickness of the piezoelectric film is $\lambda/2$.

A fifth piezoelectric resonator according to the present invention is any one of the first to fourth piezoelectric resonators further comprising a propagation layer formed between the first transducer and the second transducer.

A sixth piezoelectric resonator according to the present invention is any one of the first to fifth piezoelectric resonators further comprising an acoustic multilayer reflecting film for reflecting the bulk acoustic wave, the acoustic multilayer reflecting film having a configuration wherein first reflecting films with a predetermined acoustic impedance and second reflecting films with an acoustic impedance different from that of the first reflecting films are alternately stacked in the predetermined direction. In this sixth piezoelectric resonator the first transducer and the second transducer are stacked in the predetermined direction on the acoustic multilayer reflecting film.

A seventh piezoelectric resonator according to the present invention is any one of the first to sixth piezoelectric resonator, the piezoelectric resonator being an SMR type or diaphragm type piezoelectric resonator.

An electronic component according to the present invention comprises one of the first to seventh piezoelectric resonators.

DESCRIPTION OF THE PREFERRED EMBODIMENTS

The best mode for carrying out the present invention will be further specifically described below with reference to the drawings. The same members will be denoted by the same reference symbols throughout the accompanying drawings, without redundant description. It is noted that the description herein concerns the best mode of carrying out the present invention and the present invention is by no means intended to be limited to the mode.

Figure 1:
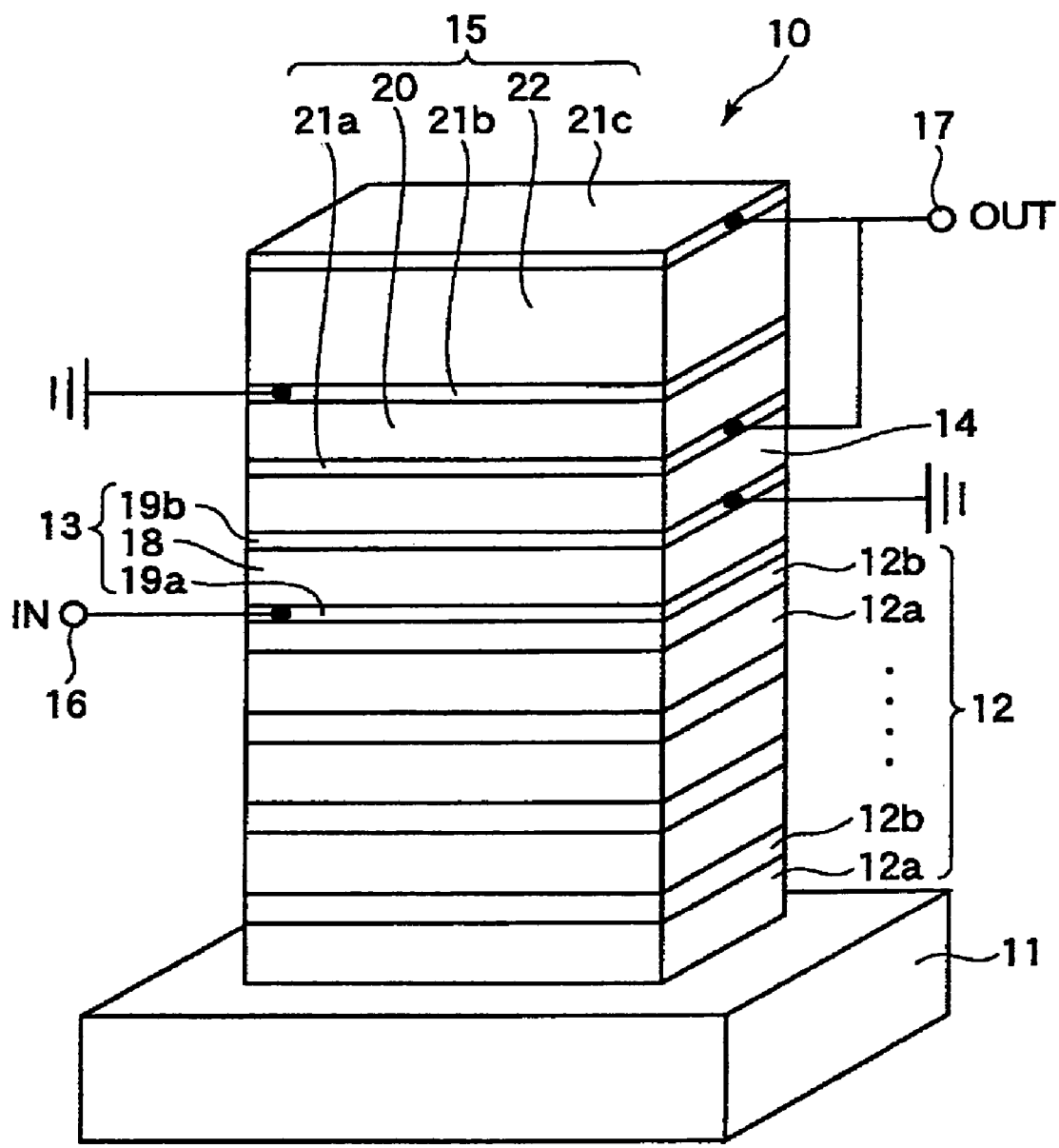
FIG. 1 is a perspective view showing a piezoelectric resonator according to an embodiment of the present invention.
Figure 2:
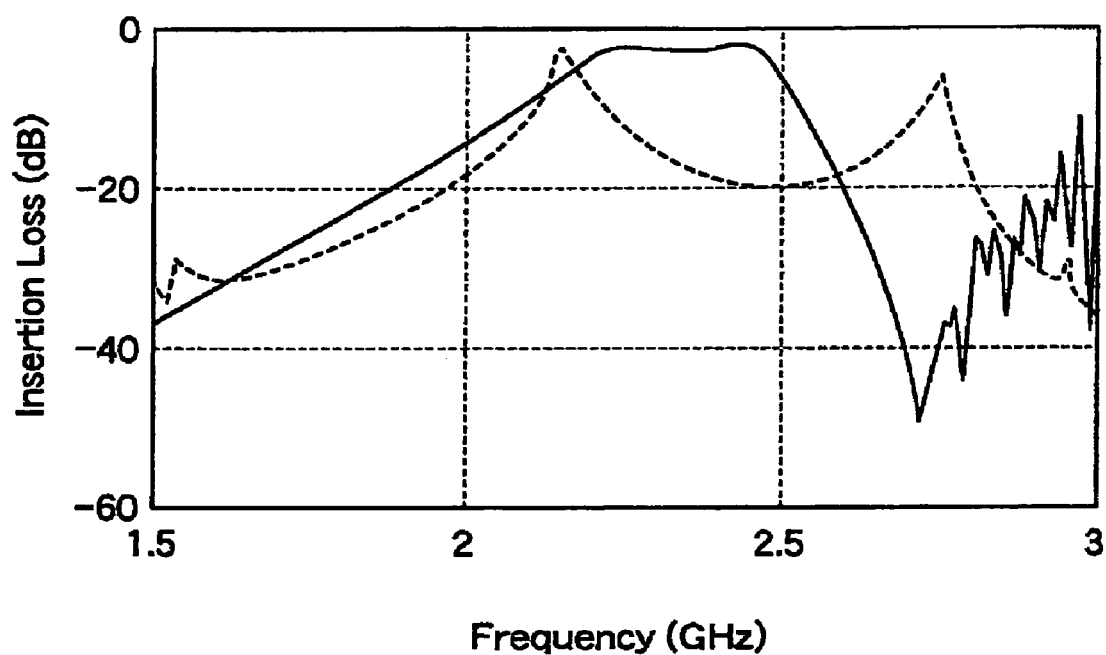
FIG. 2 is a graph showing frequency characteristics of the piezoelectric resonator shown in FIG. 1 and a piezoelectric resonator shown in FIG. 3.
Figure 3:
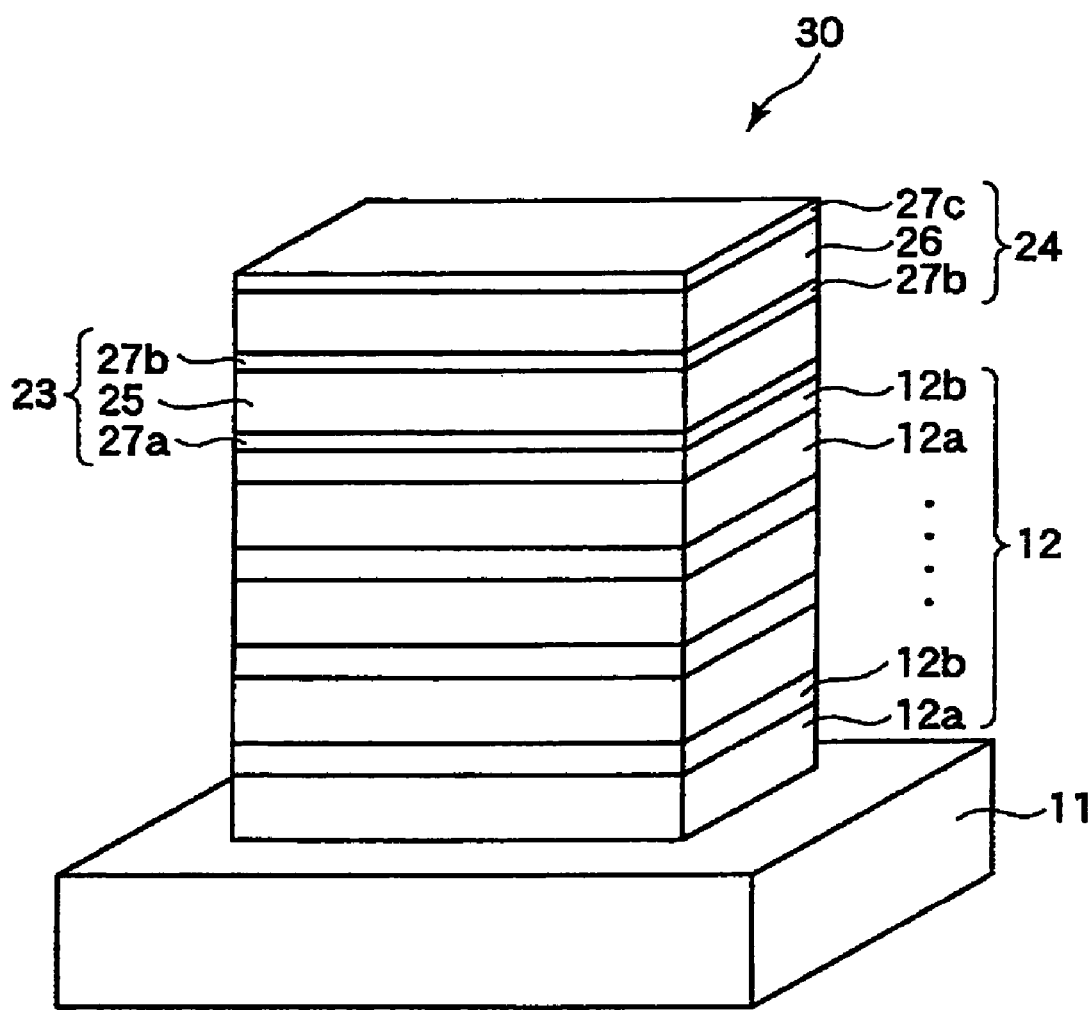
FIG. 3 is a perspective view showing the piezoelectric resonator as a comparative example.
Figure 4:
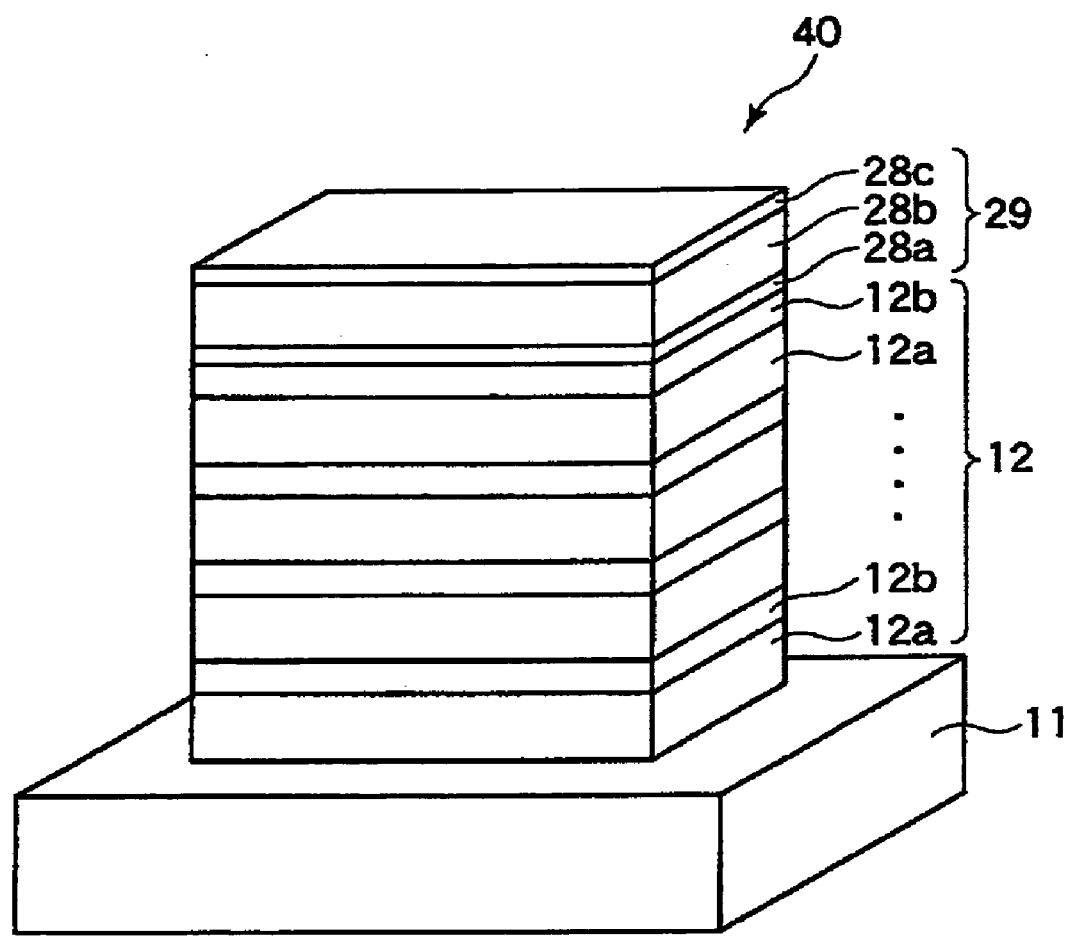
FIG. 4 is a perspective view showing a conventional piezoelectric resonator.

FIG. 1 is a perspective view showing a piezoelectric resonator according to the first embodiment of the present invention, FIG. 2 a graph showing a frequency characteristic of the piezoelectric resonator shown in FIG. 1, and FIG. 3 a perspective view showing a piezoelectric resonator as a comparative example.

The piezoelectric resonator 10 shown in FIG. 1 is called an SMR (Solidly Mounted Resonator) type piezoelectric resonator. The piezoelectric resonator 10 has a substrate 11, an acoustic multilayer reflecting film 12 disposed on one surface of the substrate 11, a first transducer 13, a propagation layer 14, and a second transducer 15.

The substrate 11 is made, for example, of silicon or glass. The acoustic multilayer reflecting film 12 is constructed in a structure in which thin films with a high acoustic impedance and thin films with a low acoustic impedance, e.g., AlN films (first reflecting films) 12a and $SiO_2$ films (second reflecting films) 12b, are alternately stacked in a predetermined direction. This predetermined direction is a direction intersecting with one surface of the substrate 11, and is the stack direction of the reflecting films in the acoustic multilayer reflecting film 12. This predetermined direction is also a direction in which the first transducer 13 and the second transducer 15 are stacked, and is a direction of propagation of the bulk acoustic wave.

In the piezoelectric resonator 10 shown in FIG. 1, an AlN film 12a is formed directly on the substrate 11, but in a piezoelectric resonator according to the present invention, an $SiO_2$ film 12b may be formed directly on the substrate 11.

The first transducer 13 is laid on the acoustic multilayer reflecting film 12, and the second transducer 15 is laid through the propagation film 14 on the first transducer 13. Namely, in the piezoelectric resonator 10 the first transducer 13 and the second transducer 15 are stacked on the acoustic multilayer film 12, and the propagation layer 14 is disposed between the first transducer 13 and the second transducer 15.

The first transducer 13 is connected to an input signal terminal (first signal terminal) 16, and the second transducer 15 to an output signal terminal (second signal terminal) 17. In the piezoelectric resonator 10, the second transducer 15 receives vibration of a bulk acoustic wave excited in the first transducer 13 by the input signal terminal 16 and propagating inside a later-described piezoelectric film, whereby a signal of a predetermined resonance frequency is extracted from the output signal terminal 17.

The first transducer 13 is comprised of a piezoelectric film 18, for example, made of AlN, and electrode films 19a, 19b located on both surfaces of this piezoelectric film 18. Namely, the first transducer 13 has the electrode film 19a, the electrode film 19b, and the piezoelectric film 18 disposed between the electrode film 19a and the electrode film 19b. The electrode film 19a, the electrode film 19b, and the piezoelectric film 18 are stacked in order in the aforementioned predetermined direction.

The second transducer 15 is comprised of a first piezoelectric film 20, for example, made of AlN, electrode films 21a, 21b located on both surfaces of the first piezoelectric film 20, a second piezoelectric film 22 of a film type different from that of the first piezoelectric film 20, e.g., ZnO, and electrode films 21b, 21c located on both surfaces of the second piezoelectric film 22. Therefore, the electrode film 21b located between the first piezoelectric film 20 and the second piezoelectric film 22 is shared as an electrode film for sandwiching the first piezoelectric film 20, and as an electrode film for sandwiching the second piezoelectric film 22. Namely, in the second transducer 15 the first piezoelectric film 20 is disposed between the electrode film 21a and the electrode film 21b, and the second piezoelectric film 22 is disposed between the electrode film 21b and the electrode film 21c. The electrode film 21a, the first piezoelectric film 20, the electrode film 21b, the second piezoelectric film 22, and the electrode film 21c are stacked in order in the predetermined direction.

In the second transducer 15, the electrode film 21a located opposite to the second piezoelectric film 22 with the first piezoelectric film 20 in between, and the electrode film 21c located opposite to the first piezoelectric film 20 with the second piezoelectric film 22 in between are connected to the output signal terminal 17, and the electrode film 21b located between the first piezoelectric film 20 and the second piezoelectric film 22 is kept at the ground potential. Namely, the electrode film 21a more distant from the second piezoelectric film 22 out of the electrode films 21a and 21b between which the first piezoelectric film 20 is sandwiched, and the electrode film 21c more distant from the first piezoelectric film 20 out of the electrode films 21*b* and 21*c* between which the second piezoelectric film 22 is sandwiched, are connected to the output signal terminal 17.

In the first transducer 13 the electrode film 19*a* located on the acoustic multilayer reflecting film 12 side is connected to the input signal terminal 16, and the electrode film 19*b* located on the opposite side thereto is kept at the ground potential.

The electrode films 19*a*, 19*b*, 21*a*, 21*b*, and 21*c* are made of a material, for example, such as Al, Au, Pt, or Mo, and the propagation film 14 is made of a dielectric material, for example, such as $SiO_2$ or insulating alumina.

The acoustic multilayer reflecting film 12 for reflecting the bulk acoustic wave is not always essential, and in a case without the acoustic multilayer reflecting film 12 the first transducer 13 is formed directly on the substrate 11. The propagation film 14 is not always essential, either.

In the present embodiment, the piezoelectric film of the second transducer 15 is composed of two layers, but may be composed of three or more layers. In that case, it is not always necessary that the film types of all the piezoelectric films should be different from each other, but the necessary condition is that a film type of at least one piezoelectric film is different from that of the other piezoelectric films. In the second transducer 15 the first piezoelectric film 20 located on the first transducer 13 side is made of AlN and the second piezoelectric film 22 on the opposite side ZnO, but it is possible to switch between the material forming the first piezoelectric film 20 and the material forming the second piezoelectric film 22.

Furthermore, it is also possible to use a piezoelectric film of a film type different from the above types as long as it has piezoelectricity. For example, one of the first piezoelectric film 20 and the second piezoelectric film 22 can be made of a material comprised essentially of AlN, i.e., a material containing AlN 50% or more. The rest of the material except for AlN is, for example, a material using a Group m element such as Ga instead of Al in AlN. The other of the first piezoelectric film 20 and the second piezoelectric film 22 can be made of a material comprised essentially of ZnO, i.e., a material containing ZnO 50% or more. The rest of the material except for ZnO is, for example, a material using a Group II element instead of Zn in ZnO.

In the piezoelectric resonator 10 the second transducer 15 is comprised of multiple layers of piezoelectric films, but one or both of the first transducer 13 and the second transducer 15 may be comprised of multiple layers of piezoelectric films.

In the piezoelectric resonator 10 the shape of the transducers 13, 15 and the propagation film 14 is rectangular, but may be any shape such as a square, a circle, or an ellipse.

In the present embodiment, the thickness of the AlN films 12*a* being the first reflecting films, and the thickness of the $SiO_2$ films 12*b* being the second reflecting films, which constitute the acoustic multilayer reflecting film 12, are approximately equal to a quarter of the wavelength $\lambda$ of the bulk acoustic wave in film; the AlN films 12*a* are set to be 1.1 µm; the $SiO_2$ films 12*b* are set to be 0.58 µm.

Where $\lambda$ represents the wavelength of the bulk acoustic wave in film, determined by the film type of the piezoelectric film as described above the thicknesses of the piezoelectric films 18, 20, 22 are approximately equal to half of the wavelength $\lambda$ i.e., ($\lambda/2$). Namely, the thicknesses of the piezoelectric films 18, 20, 22 are set so as to be half of the wavelength $\lambda$ of the bulk acoustic wave propagating in each piezoelectric film 18, 20, 22, near the resonance frequency of the piezoelectric resonator 10. Specifically, the thicknesses of the piezoelectric film 18 of the first transducer 13 and the first piezoelectric film 20 of the second transducer 15 of AlN are set to be 2 µm, and the thickness of the second piezoelectric film 22 of the second transducer 15 of ZnO is set to be 1.21 µm.

In the piezoelectric resonator 10 of the above configuration, when an input signal is applied to the input signal terminal 16, the first transducer 12 strongly excites the bulk acoustic wave at a specific frequency, and this is transmitted to the second transducer 15. Then the second transducer 15 converts the bulk acoustic wave to an electric signal, and the signal (output signal) of the specific frequency is extracted from the output signal terminal 17. This obtains filter characteristics in which a predetermined frequency band is defined as a passing band.

Since the second transducer 15 has the first piezoelectric film 20 and the second piezoelectric film 22 the film types of which are different from each other, as described above, the first piezoelectric film 20 and the second piezoelectric film 22 collaborate to receive the transmitted bulk acoustic wave, and the bulk acoustic wave is outputted as an output signal after electric synthesis.

In this configuration, there appear a resonance peak in the first piezoelectric film 20 and a resonance peak in the second piezoelectric film 22 close to each other. Therefore, a filter property of a very wide band can be acquired by insertion of a matching circuit.

A solid line in FIG. 2 indicates a frequency characteristic where a matching circuit is inserted in the piezoelectric resonator 10 shown in FIG. 1.

It is seen from FIG. 2 that the bandwidth with the insertion loss being −3 dB is approximately 270 MHz, demonstrating a broadband filter characteristic.

FIG. 3 shows a piezoelectric resonator 30 as a comparative example, and a frequency characteristic thereof is indicated by a dashed line in FIG. 2.

In the piezoelectric resonator 30 as shown, different from the piezoelectric resonator 10 of the present embodiment shown in FIG. 1, each of the first transducer 23 and the second transducer 24 is comprised of a piezoelectric film 25 or a piezoelectric film 26, and electrode films 27*a*, 27*b* or electrode films 27*b*, 27*c* located on both sides of the piezoelectric film 25 or the piezoelectric film 26. Namely, neither of the transducers 23, 24 has a plurality of piezoelectric films.

Since the frequency characteristic of the piezoelectric resonator 30 of this configuration is such that the bulk acoustic wave is excited at frequencies corresponding to ($\lambda/2$)×integers, the frequency difference between peaks in two passing regions are very large, about 600 MHz, as indicated by the dashed line in FIG. 2, so as to demonstrate a passing property of a very narrow band. In this case, it is difficult to obtain a broad passing band by making use of two peaks.

The above described the application of the present invention to the SMR type piezoelectric resonator, but the present invention is applicable to all types of stacked piezoelectric resonators using the piezoelectric film, such as the diaphragm type piezoelectric resonators in which the substrate is cut in part to facilitate propagation of the bulk acoustic wave.

The diaphragm type piezoelectric resonators can also be constructed with or without the acoustic multilayer film as the SMR type piezoelectric resonators were. In the diaphragm type piezoelectric resonators without the acoustic multilayer film, however, the substrate is absent immediately below the lower electrode by being removed by etching or the like, in order to permit the vibrating part of the lower electrode to vibrate almost freely, different from the SMR type piezoelectric resonators.

Figure 5:
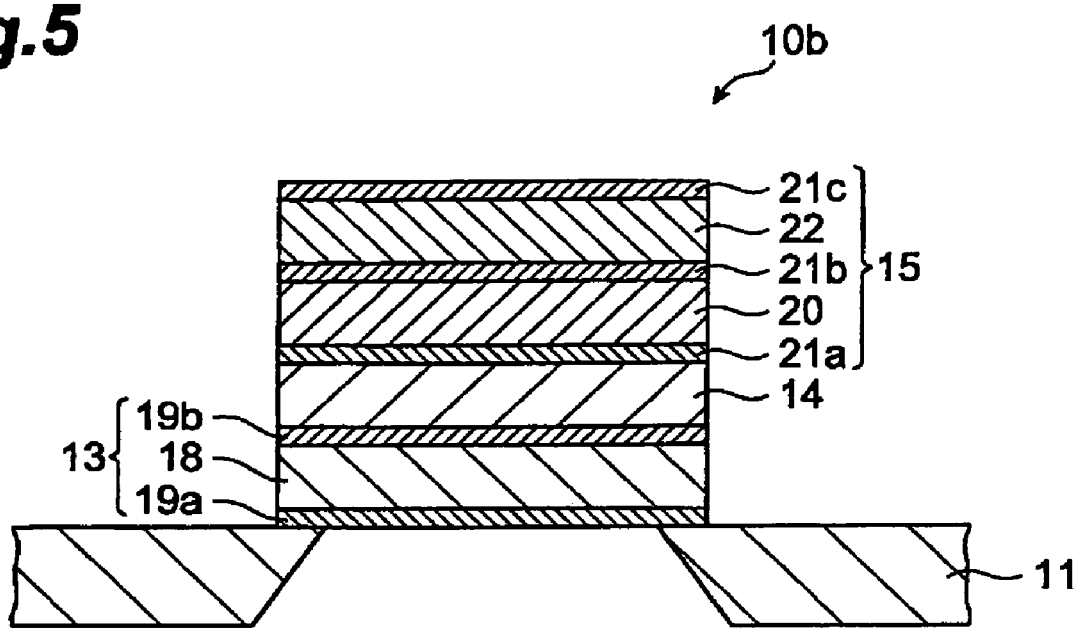
FIG. 5 is a sectional view showing a piezoelectric resonator according to another embodiment of the present invention.

FIG. 5 is a sectional view of a piezoelectric resonator according to another embodiment of the present invention. The piezoelectric resonator 10b shown in FIG. 5 is a diaphragm type piezoelectric resonator. The piezoelectric resonator 10b has a substrate 11, a first transducer 13, a propagation layer 14, and a second transducer 15. The first transducer 13, the propagation layer 14, and the second transducer 15 are stacked in order in the aforementioned predetermined direction (i.e., a direction intersecting with a principal surface of the substrate 11) on one principal surface of the substrate 11. The substrate 11 has a hole bored below the first transducer 13. In the piezoelectric resonator 10b the materials forming the substrate 11, the first transducer 13, the propagation layer 14, and the second transducer 15 are the same as those forming the corresponding elements in the piezoelectric resonator 10.

The present invention can be applied electronic components such as filters and duplexers with the piezoelectric resonators described above.

As the embodiments of the present invention were described above, the present invention successfully provides the following effect. Namely, the present invention involves constructing the transducers of the first piezoelectric film and the second piezoelectric film the film types of which are different from each other, so that the resonance peaks in the respective piezoelectric films appear close to each other, thereby enabling implementation of the piezoelectric resonator with a broadband passing property.

What is claimed is:

1. A piezoelectric resonator comprising:
    a first transducer connected to a first signal terminal; and
    a second transducer connected to a second signal terminal,
    wherein the first transducer and the second transducer are stacked in a predetermined direction,
    wherein the second transducer outputs a signal of a predetermined resonance frequency from a bulk acoustic wave excited in the first transducer and propagating in the predetermined direction inside a piezoelectric film,
    wherein the second transducer has a first piezoelectric film and a second piezoelectric film which are provided in order in the predetermined direction, the first piezoelectric film being sandwiched between a pair of electrode films on both sides in the predetermined direction, the second piezoelectric film being comprised of a film type different from that of the first piezoelectric film and being sandwiched between a pair of electrode films on both sides in the predetermined direction, and
    wherein the electrode film more distant from the second piezoelectric film out of the pair of electrode films between which the first piezoelectric film is sandwiched, and the electrode film more distant from the first piezoelectric film out of the pair of electrode films between which the second piezoelectric film is sandwiched, are connected to the second signal terminal.

2. The piezoelectric resonator according to claim 1, wherein one of the first piezoelectric film and the second piezoelectric film is comprised essentially of AlN and the other is comprised essentially of ZnO.

3. The piezoelectric resonator according to claim 1, wherein, where $\lambda$ represents a wavelength of the bulk acoustic wave in the piezoelectric film, determined by the film type of the piezoelectric film, a thickness of the piezoelectric film is $\lambda/2$.

4. The piezoelectric resonator according to claim 1, further comprising a propagation layer formed between the first transducer and the second transducer.

5. The piezoelectric resonator according to claim 1, further comprising an acoustic multilayer reflecting film for reflecting the bulk acoustic wave, the acoustic multilayer reflecting film having a configuration wherein first reflecting films with a predetermined acoustic impedance and second reflecting films with an acoustic impedance different from that of the first reflecting films are alternately stacked in the predetermined direction, wherein the first transducer and the second transducer are stacked in the predetermined direction on the acoustic multilayer reflecting film.

6. The piezoelectric resonator according to claim 1, said piezoelectric resonator being an SMR type piezoelectric resonator or a diaphragm type piezoelectric resonator.

7. An electronic component comprising the piezoelectric resonator as set forth in claim 1.

* * * * *